US006809385B2

(12) United States Patent
Ebina et al.

(10) Patent No.: US 6,809,385 B2
(45) Date of Patent: Oct. 26, 2004

(54) SEMICONDUCTOR INTEGRATED CIRCUIT DEVICE INCLUDING NONVOLATILE SEMICONDUCTOR MEMORY DEVICES HAVING CONTROL GATES CONNECTED TO COMMON CONTACT SECTION

(75) Inventors: Akihiko Ebina, Nagano-ken (JP); Yutaka Maruo, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/052,549

(22) Filed: Jan. 23, 2002

(65) Prior Publication Data

US 2002/0100929 A1 Aug. 1, 2002

(30) Foreign Application Priority Data

Jan. 30, 2001 (JP) ........................................ 2001-021930

(51) Int. Cl.[7] ............................................. H01L 29/792
(52) U.S. Cl. ....................... 257/365; 257/324; 257/411
(58) Field of Search ................................. 257/314–326, 257/365, 368, 390, 401, 410, 411, 637, 640, 900, 366, 382–385, 391

(56) References Cited

U.S. PATENT DOCUMENTS

| | | | | | |
|---|---|---|---|---|---|
| 4,372,031 | A | * | 2/1983 | Tsaur et al. ................. | 438/257 |
| 5,408,115 | A | | 4/1995 | Chang | |
| 5,422,504 | A | | 6/1995 | Chang et al. | |
| 5,494,838 | A | | 2/1996 | Chang et al. | |
| 5,883,001 | A | * | 3/1999 | Jin et al. .................... | 438/624 |
| 5,891,775 | A | | 4/1999 | Hisamune ................... | 438/267 |
| 5,969,383 | A | | 10/1999 | Chang et al. | |
| 6,091,101 | A | * | 7/2000 | Wang ......................... | 257/315 |
| 6,177,318 | B1 | | 1/2001 | Ogura et al. | |
| 6,248,633 | B1 | * | 6/2001 | Ogura et al. ................ | 438/267 |
| 6,255,166 | B1 | | 7/2001 | Ogura et al. | |
| 6,388,293 | B1 | * | 5/2002 | Ogura et al. ................ | 257/365 |
| 2002/0168813 | A1 | * | 11/2002 | Ogura ........................ | 438/200 |
| 2003/0053345 | A1 | | 3/2003 | Moriya et al. .............. | 365/200 |

FOREIGN PATENT DOCUMENTS

| | | |
|---|---|---|
| JP | A-5-326976 | 10/1993 |
| JP | A 7-161851 | 6/1995 |
| JP | A 2001-156188 | 6/2001 |
| JP | A-2002-203918 | 7/2002 |

OTHER PUBLICATIONS

Hayashi et al., "Twin MONOS Cell with Dual Control Gates", IEEE VLSI Technology Digest, 2000.
Chang et al., "A New SONOS Memory Using SOurce–Side Injection for Programming", IEEE Electron Device Letters, vol. 9, No. 7, Jul. 1998, pp. 253–255.
Chen et al., A Novel Flash Memory Device with S Plit Gate Source Side Injection and ONO Charge Storage Stack (SPIN), VLSI Technology Digest, pp. 63–64, 1997.
"Twin MONOS cell with Dual Control Gates", Yutaka Hayashi, Seiki Ogura, Tomoya Saito, Tomoko Ogura, 2000 Symposium on VLSI Technology Digest of Technical Papers.

* cited by examiner

*Primary Examiner*—Long Pham
*Assistant Examiner*—Marcos D. Pizarro-Crespo
(74) *Attorney, Agent, or Firm*—Oliff & Berridge, PLC

(57) ABSTRACT

A semiconductor integrated circuit device including a memory cell array in which nonvolatile semiconductor memory devices (memory cells) are arranged in a matrix with a plurality of rows and columns. The nonvolatile semiconductor memory device includes a word gate formed on a semiconductor substrate with a first gate insulating layer interposed, an impurity diffusion layer formed in the semiconductor substrate which forms either a source region or a drain region, and first and second control gates in the shape of sidewalls formed along either side of the word gate. Each of the first and second control gates is disposed on the semiconductor substrate with a second gate insulating layer interposed, and also on the word gate with a side insulating layer interposed. The first and second control gates extend in the column direction. A pair of first and second control gates which are adjacent in the row direction is connected to a common contact section.

30 Claims, 11 Drawing Sheets

SEMICONDUCTOR INTEGRATED CIRCUIT DEVICE INCLUDING NONVOLATILE SEMICONDUCTOR MEMORY DEVICES HAVING CONTROL GATES CONNECTED TO COMMON CONTACT SECTION

Japanese Patent Application No. 2001-21930, filed on Jan. 30, 2001, is hereby incorporated by reference in its entirety.

BACKGROUND

1. Technical Field

The present invention relates to a semiconductor integrated circuit device including nonvolatile semiconductor memory devices.

2. Related Art

As one type of nonvolatile semiconductor memory device, a MONOS (Metal Oxide Nitride oxide Semiconductor) memory device is known. In the MONOS memory device, a gate insulating layer disposed between a channel and a gate is formed of a laminate consisting of two silicon oxide layers and a silicon nitride layer, and charges are trapped in the silicon nitride layer.

A device shown in FIG. 16 is known as such a MONOS nonvolatile semiconductor memory device (Y. Hayashi, et al., 2000 *Symposium on VLSI Technology Digest of Technical Papers*, 122–123).

In this MONOS memory cell 100, a word gate 14 is formed on a semiconductor substrate 10 with a first gate insulating layer 12 interposed. A first control gate 20 and a second control gate 30 are disposed on either side of the word gate 14 in the shape of sidewalls. A second gate insulating layer 22 is present between the bottom of the first control gate 20 and the semiconductor substrate 10. A side insulating layer 24 is present between the side of the first control gate 20 and the word gate 14. A second gate insulating layer 32 is present between the bottom of the second control gate 30 and the semiconductor substrate 10. A side insulating layer 34 is present between the side of the second control gate 30 and the word gate 14. Impurity diffusion layers 16 and 18 forming a source region or a drain region are formed in the semiconductor substrate 10 in a region between the control gate 20 and the control gate 30 facing each other in adjacent memory cells.

As described above, one memory cell 100 includes two MONOS memory elements, one on each side of the word gate 14. These MONOS memory elements can be controlled separately. Therefore, the memory cell 100 is capable of storing 2 bits of information.

This MONOS memory cell operates as follows. One of the control gates of the memory cell 100 is capable of selecting read or write operation separately by biasing the other control gate to an override voltage.

A write (program) operation is described below with reference to a case where electrons are injected into the second gate insulating layer (ONO film) 32 at the left in CG [i+1] in FIG. 16. In this case, the bit line (impurity diffusion layer) 18 (D[i+1]) is biased to a drain voltage of 4 to 5 V. The control gate 30 (CG[i+1]) is biased to 5 to 7 V in order to cause hot electrons to be injected into the second gate insulating layer 32 at the left of the control gate 30 (CG[i+1]). A word line connected to the word gates 14 (Gw[i] and Gw[i+1]) is biased at a voltage slightly higher than the threshold value of the word gate in order to limit the program current to a specific value (10 μA or less). The control gate 20 (CG[i]) is biased to an override voltage. This override voltage enables a channel under the control gate 20 (CG[i]) to conduct irrespective of the memory state. A left side bit line 16 (D[i]) is biased to ground. Control gates and diffusion layers in unselected memory cells are grounded.

In an erase operation, stored charges (electrons) are erased by injection of hot holes. Hot holes can be generated by B—B tunneling at the surface of the bit diffusion layer 18. At this time, the voltage Vcg of the control gate is biased to a negative voltage (−5 to −6 V) and the voltage of the bit diffusion layer is biased to 5 to 6 V.

In the above-cited reference, according to the MONOS memory cell, two separately controllable programming sites in a single memory cell can provide bit density of $3F^2$.

SUMMARY

According to one embodiment of the present invention, there is provided a semiconductor integrated circuit device having a memory cell array in which nonvolatile semiconductor memory devices are arranged in a matrix with a plurality of rows and columns, wherein each of the nonvolatile semiconductor memory devices comprises:

a word gate formed on a semiconductor layer with a first gate insulating layer interposed;

an impurity diffusion layer which forms either a source region or a drain region; and first and second control gates in the shape of sidewalls formed along either side of the word gate, wherein:

the first control gate is disposed on the semiconductor layer with a second gate insulating layer interposed, and also on the word gate with a side insulating layer interposed;

the second control gate is disposed on the semiconductor layer with another second gate insulating layer interposed, and also on the word gate with another side insulating layer interposed;

the first and second control gates extend in a first direction; and a pair of the first and second control gates, adjacent in a second direction which intersects the first direction, is connected to a common contact section.

According to this semiconductor integrated circuit device, since every pair of the control gates in the shape of sidewalls is connected to the common contact section, electrical connection with narrow control gates can be achieved reliably.

The semiconductor integrated circuit device of the present invention has the following features.

(A) Each of the first and second control gates may be formed of a conductive layer extending in the direction in which the impurity diffusion layer extends.

(B) The common contact section may be formed in the same step as the first and second control gates, be connected to the first and second control gates, and include a conductive layer formed of the same material as the first and second control gates.

(C) The common contact section may include an insulating layer formed on the semiconductor layer, a conductive layer formed on the insulating layer, and a cap layer formed on the conductive layer. The insulating layer may be formed by the same step as the side insulating layer located between the word gate and the control gate, and may be formed of a laminate consisting of a first silicon oxide layer, a silicon nitride layer, and a second silicon oxide layer.

(D) The side insulating layers may be located between the word gate and the first and second control gates; and the upper ends of the side insulating layers may be located higher than the first and second control gates with respect to the semiconductor layer. This enables a buried insulating layer which covers the control gates to be formed reliably. Specifically, the buried insulating layer may be formed between the two side insulating layers disposed in contact with the first and second control gates; and the buried insulating layer may cover the adjacent first and second control gates.

(E) The common contact section may be provided in contact with one end of the impurity diffusion layer. The common contact sections may be provided alternately on one end and the other end of a plurality of impurity diffusion layers.

(F) The memory cell array may be divided into a plurality of blocks; and the impurity diffusion layers in blocks adjacent to each other in the first direction may be connected to each other through a contact impurity diffusion layer formed in the semiconductor layer.

(G) The second gate insulating layer may be formed of a laminate consisting of a first silicon oxide layer, a silicon nitride layer, and a second silicon oxide layer. The side insulating layer may be located between the word gate and the control gate, and be formed of a first silicon oxide layer, a silicon nitride layer, and a second silicon oxide layer.

DETAILED DESCRIPTION

1. Device Structure

Figure 1:
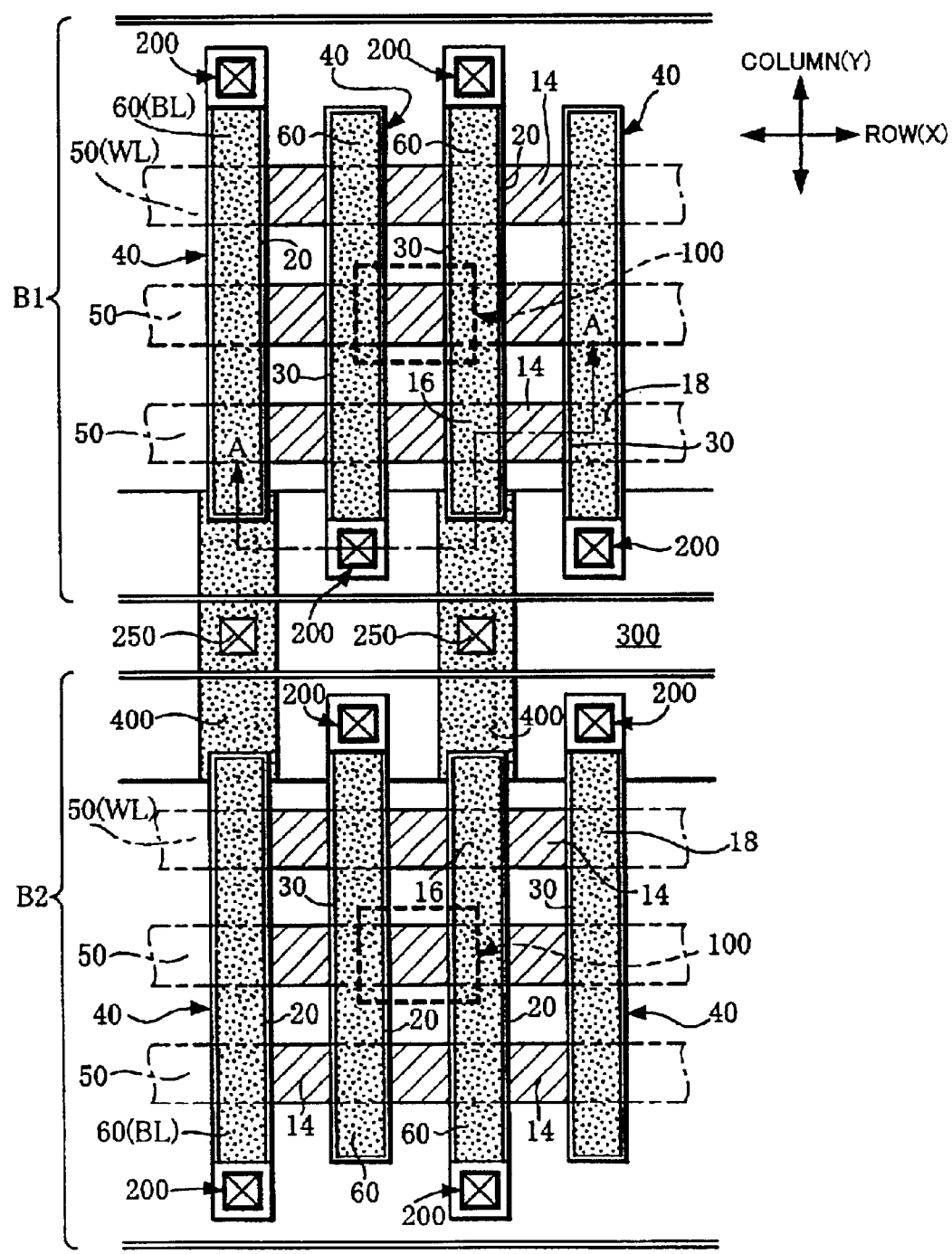
FIG. 1 is a plan view schematically showing a layout of a semiconductor integrated circuit device according to an embodiment of the present invention.
Figure 2:
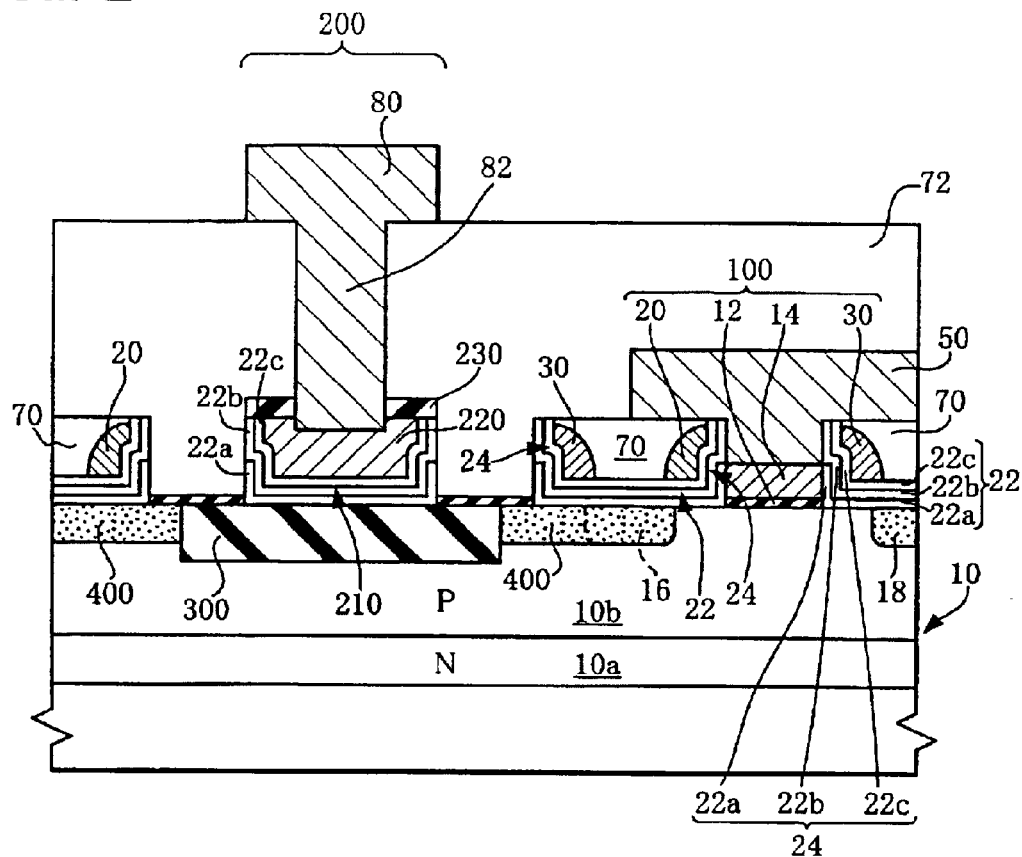
FIG. 2 is a cross-sectional view schematically showing a section taken along the line A—A in FIG. 1.

FIG. 1 is a plan view schematically showing a layout of a semiconductor integrated circuit device including nonvolatile semiconductor memory devices according to an embodiment of the present invention. FIG. 2 is a cross-sectional view schematically showing a section taken along the line A—A in FIG. 1.

In the semiconductor integrated circuit device according to this embodiment of the invention, the above-described conventional nonvolatile semiconductor memory devices (memory cells) 100 are arranged in a matrix with a plurality of rows and columns, thereby making up a memory cell array.

The layout of the semiconductor integrated circuit device according to this embodiment is described below with reference to FIG. 1.

FIG. 1 shows a first block B1 and a second block B2 adjacent thereto. The first block B1 and the second block B2 are isolated by an element isolation region 300. In each of the blocks B1 and B2, a plurality of word lines 50 (WL) extending in the row direction (X direction) and a plurality of bit lines 60 (BL) extending in the column direction (Y direction) are provided. The word lines 50 are provided in contact with word gates 14. Impurity diffusion layers 16 and 18 form the bit lines 60.

Each of first and second control gates 20 and 30 is formed of a conductive layer 40 extending in the column direction, specifically, along the sides of the word gate 14. In this embodiment, the conductive layer 40 which forms the first and second control gates 20 and 30 is formed so as to enclose each of the impurity diffusion layers 16 and 18. One end of the first control gate 20 and one end of the second control gate 30 are connected and the other ends are connected to a common contact section 200. Therefore, as shown in FIG. 1, the common contact sections 200 are staggered relative to each other. Also, the first and second control gates 20 and 30 have a function of a control gate for the memory cells and a function of interconnection which connects the control gates arranged in the column direction.

Each memory cell 100 includes the word gate 14, the first control gate 20, the second control gate 30, the impurity diffusion layer 16 and the impurity diffusion layer 18. The impurity diffusion layers 16 and 18 are formed outside the first and second control gates 20 and 30. The adjacent memory cells 100 share the impurity diffusion layers 16 and 18.

In the blocks B1 and B2 adjacent in the column direction, the impurity diffusion layers 16 are connected at the ends having no common contact section 200, by a contact impurity diffusion layer 400 formed in the semiconductor substrate. A contact 250 to the bit line 60 is formed on the contact impurity diffusion layer 400. Also, the impurity diffusion layers 18 which are adjacent in the column direction are connected by a contact impurity diffusion layer (not shown). Therefore, the contacts 250 are staggered relative to each other.

The cross-sectional structure of the semiconductor integrated circuit device is described below with reference to FIG. 2.

The word gate 14 is formed on the main surface of a semiconductor substrate 10 with a first gate insulating layer 12 interposed. The impurity diffusion layers 16 and 18 are formed in the semiconductor substrate 10. Each of impurity diffusion layers 16 and 18 functions as a source region or a drain region. The first and second control gates 20 and 30 are formed on either side of the word gate 14 with a side insulating layer 24 interposed. The control gates are the same shape as sidewall insulating spacers in conventional MOS transistor. In this embodiment of the present invention, the semiconductor substrate 10 has an N-type first well 10a and a P-type second well 10b formed in the first well 10a. The first well 10a has a function of electrically isolating the second well 10b from other regions of the semiconductor substrate 10.

The first control gate 20 is disposed on the second well 10b in the semiconductor substrate 10 with a second gate insulating layer 22 interposed, and disposed on one side of the word gate 14 with a side insulating layer 24 interposed. The second control gate 30 is disposed on the second well 10b in the semiconductor substrate 10 with the second gate insulating layer 22 interposed, and disposed on the other side of the word gate 14 with the side insulating layer 24 interposed. A first silicon oxide layer 22a, a silicon nitride layer 22b, and a second silicon oxide layer 22c make up the second gate insulating layer 22 and the side insulating layer 24. The second gate insulating layer 22 functions as a charge storage region. The first silicon oxide layer 22a mainly functions as a tunnel film through which carriers (electrons, for example) pass. The silicon nitride layer 22b mainly functions as a charge storage layer in which the carriers are trapped.

The side insulating layers 24 formed on both sides of the word gate 14 have a function of electrically isolating the word gate 14 from the control gates 20 and 30. There are no specific limitations to the structure of the side insulating layer 24 insofar as the side insulating layer 24 has such a function. In this embodiment, the side insulating layer 24 and the second gate insulating layer 22 are formed in the same step and have the same layer structure. The side insulating layers 24 are formed so that the upper end thereof is located at a position higher than the upper ends of control gates 20 and 30 with respect to the semiconductor substrate 10. In the adjacent memory cells 100, a buried insulating layer 70 is formed between the first control gate 20 and the second control gate 30 adjacent thereto. The buried insulating layer 70 covers the control gates 20 and 30 so that at least the control gates 20 and 30 are not exposed.

The common contact section 200 applies a voltage to the control gates 20 and 30. The common contact section 200 includes an insulating layer 210, a conductive layer 220, and a cap layer 230 which are formed over the element isolation region 300. The insulating layer 210 is formed in the same step as the second gate insulating layer 22 and the side insulating layer 24. The insulating layer 210 is formed of a laminate consisting of the first silicon oxide layer 22a, the silicon nitride layer 22b, and the second silicon oxide layer 22c. The conductive layer 220 is formed in the same step as the first and second control gates 20 and 30. The conductive layer 220 is connected to the control gates 20 and 30 and formed of the same material as the control gates 20 and 30. The cap layer 230 is formed of an insulating layer such as a silicon nitride layer. The cap layer 230 functions as a mask layer during patterning of the control gates 20 and 30 and the conductive layer 220.

An interlayer dielectric 72 is provided over the semiconductor substrate 10 on which the memory cells 100, the common contact sections 200, and the like are formed. The interlayer dielectric 72 has a contact hole which reaches the conductive layer 220 in the contact section 200, and this contact hole is filled with a conductive layer 82. The conductive layer 82 is connected to an interconnect layer 80 formed on the interlayer dielectric 72.

In the semiconductor integrated circuit device according to this embodiment of the present invention, every pair of control gates 20 and 30 in the shape of sidewalls is connected to the common contact section 200 in the shape of a pad, whereby an electrical connection with the control gates can be achieved reliably. Specifically, the control gate of the present invention has a shape of sidewall and generally has a width of 0.1 μm or less. Therefore, it is important to secure an electrical connection with such control gates. In this embodiment, electrical contact with the control gates can be secured by the common contact section in the minimum area.

2. Fabrication Method of Semiconductor Integrated Circuit Device

A method of fabricating the semiconductor integrated circuit device according to the embodiment of the present invention is described below with reference to FIGS. 3 to 14. Each cross-sectional view is a section taken along the line A—A shown in FIG. 1. In FIGS. 3 to 14, components that are the same as those in FIG. 1 are denoted by the same reference numbers and further description is omitted.

Figure 3:
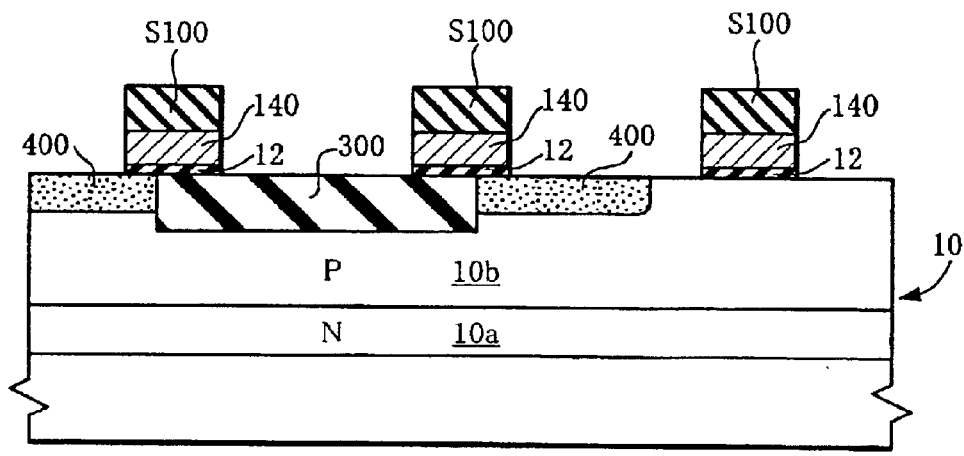
FIG. 3 is a cross-sectional view showing one step in a method of fabricating the semiconductor integrated circuit device shown in FIGS. 1 and 2.
Figure 4:
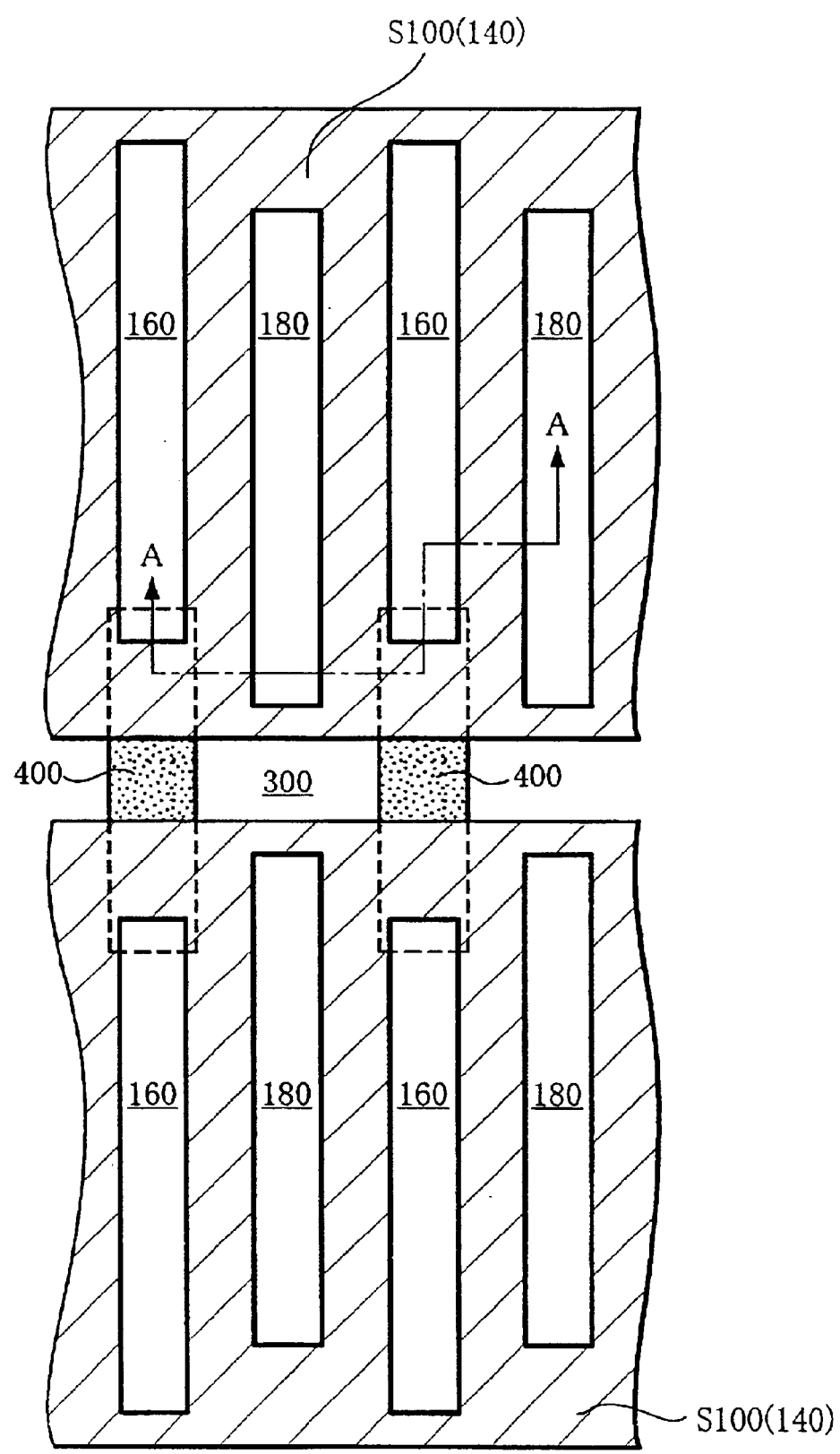
FIG. 4 is a plan view showing the step in the method of fabricating the semiconductor integrated circuit device shown in FIG. 3.

(1) The element isolation region 300 is formed on the surface of the semiconductor substrate 10 using a LOCOS process or a trench isolation process, as shown in FIGS. 3 and 4. The deep N-type first well 10a and the P-type second well 10b which is shallower than the first well 10a are then formed. The contact impurity diffusion layers 400 for forming the contacts 250 (see FIG. 1) for the bit line 60 are formed in the semiconductor substrate 10.

The first gate insulating layer 12, a word gate layer 140 consisting of doped polysilicon, and a stopper layer S100 used in a chemical mechanical polishing (CMP) process described later are formed on the surface of the semiconductor substrate 10. A silicon nitride layer or the like may be used as the stopper layer S100.

A laminate consisting of the word gate layer 140 and the stopper layer S100 is formed on the entire surface of the semiconductor substrate 10 excluding openings 160 and 180, as shown in FIG. 4. The openings 160 and 180 correspond to the regions in which the impurity diffusion layers 16 and 18 are formed by ion implantation described later. The line A—A shown in FIG. 4 corresponds to the line A—A shown in FIG. 1. The side insulating layers and the control gates are formed along the edges of the openings 160 and 180 in a step described later.

Figure 5:
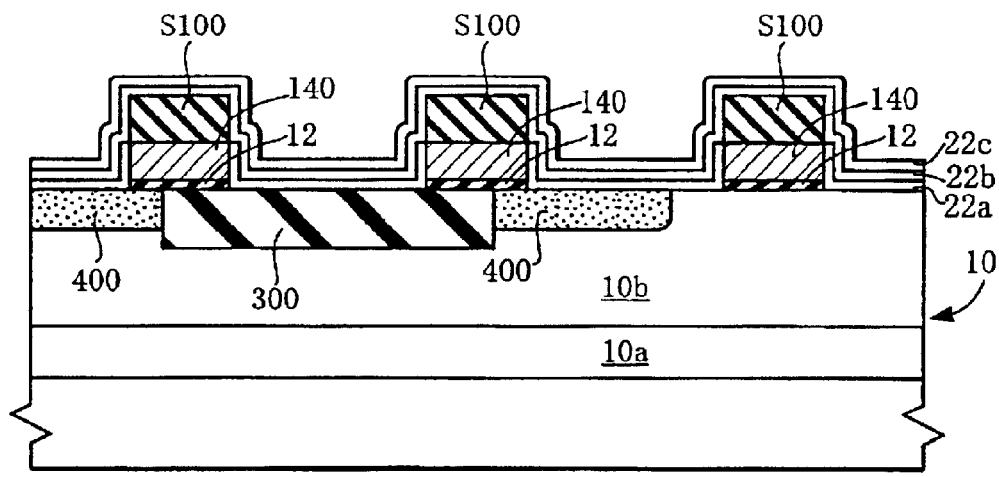
FIG. 5 is a cross-sectional view showing one step in the method of fabricating the semiconductor integrated circuit device shown in FIGS. 1 and 2.

(2) The first silicon oxide layer 22a, the silicon nitride layer 22b, and the second silicon oxide layer 22c are formed in that order on the surface of the semiconductor substrate 10 on which the laminate consisting of the word gate layer 140 and the stopper layer S100 is formed, as shown in FIG. 5. The first silicon oxide layer 22a may be formed by using a thermal oxidation process, for example. The silicon nitride layer 22b may be deposited by using a chemical vapor deposition (CVD) process after annealing in an ammonia atmosphere, for example. The second silicon oxide layer 22c may be deposited by using a CVD process such as a high temperature oxidation process. It is preferable to anneal these deposited layers, thereby causing each layer to be densified.

The first silicon oxide layer 22a, the silicon nitride layer 22b, and the second silicon oxide layer 22c are patterned in a step described later, thereby forming the second gate insulating layers 22 and the side insulating layers 24 for the control gates 20 and 30 and the insulating layers 210 in the common contact sections 200, as shown in FIG. 2.

Figure 6:
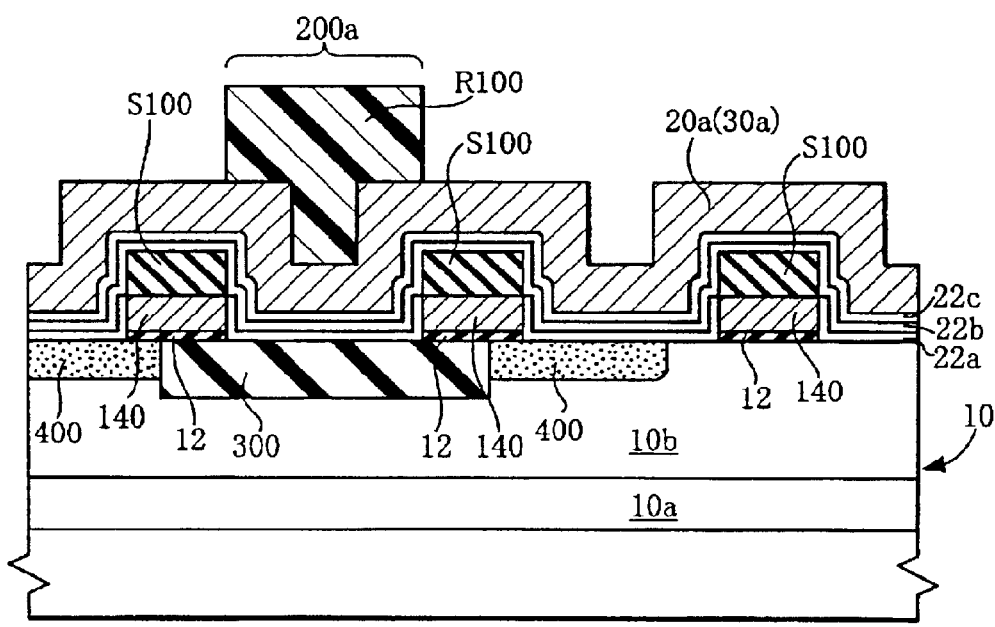
FIG. 6 is a cross-sectional view showing one step in the method of fabricating the semiconductor integrated circuit device shown in FIGS. 1 and 2.

(3) A doped polysilicon layer 20a (30a) is formed on the entire surface of the second silicon oxide layer 22c, as shown in FIG. 6. The doped polysilicon layer 20a (30a) is patterned in a step described later, thereby making up the conductive layers 40 (see FIG. 1) which form the control gates 20 and 30 and the conductive layers 220 (see FIG. 2) in the common contact sections 200.

Figure 7:
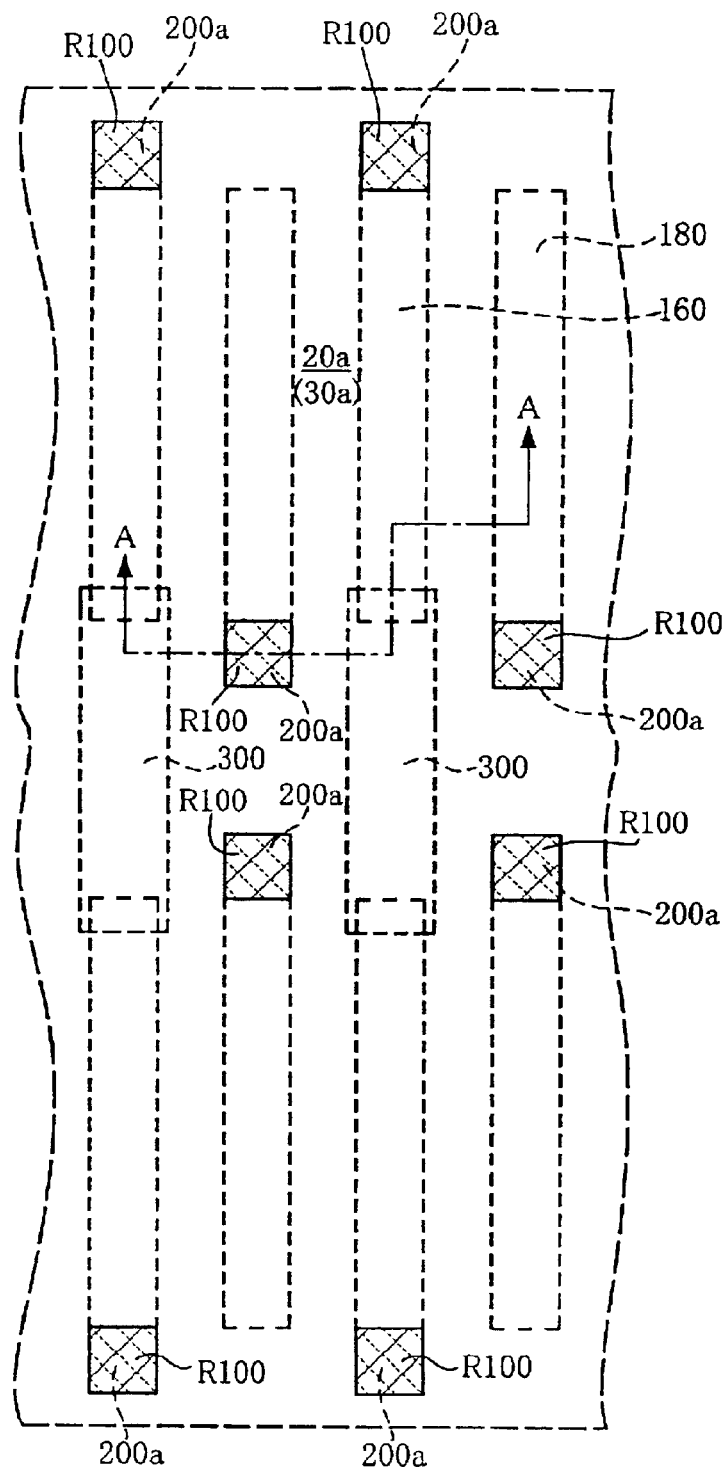
FIG. 7 is a plan view showing the step in the method of fabricating the semiconductor integrated circuit device shown in FIG. 6.

Resist layers R100 are then formed in regions 200a in which the common contact sections 200 are formed (hereinafter called "common contact section formation regions"). The resist layers R100 are arranged in a staggered pattern. In this embodiment, the resist layers R100 are provided at locations corresponding to the common contact section formation regions 200a, as shown in FIG. 7.

Figure 8:
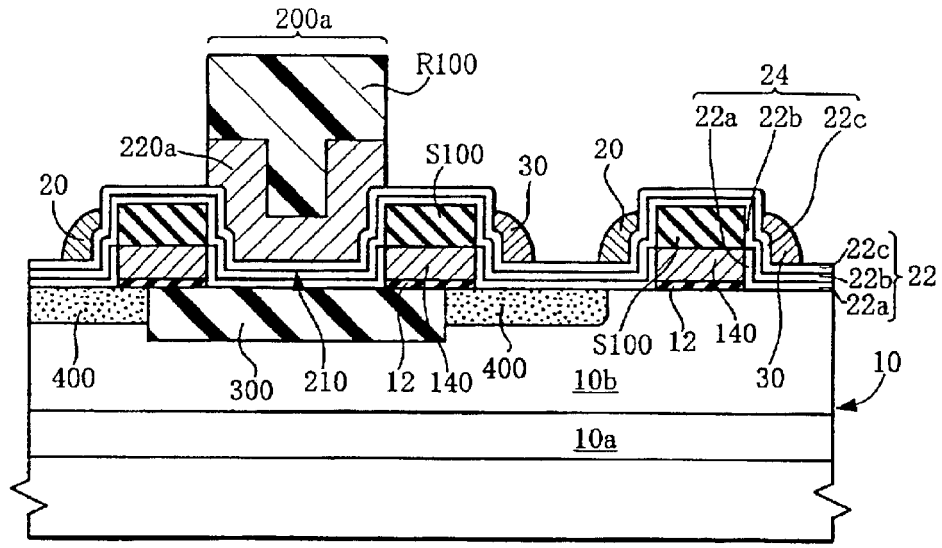
FIG. 8 is a cross-sectional view showing one step in the method of fabricating the semiconductor integrated circuit device shown in FIGS. 1 and 2.

(4) The entire surface of the doped polysilicon layer 20a is anisotropically etched, thereby forming the first and second control gates 20 and 30 and the conductive layers 220a in the common contact sections, as shown in FIG. 8. Specifically, the control gates 20 and 30 in the shape of sidewalls are formed on the second gate insulating layer 22, along the sides of the openings 160 and 180 in the word gate layer 140 (see FIG. 4), with the side insulating layers 24 interposed therebetween. At the same time, the conductive layers 220a in the common contact sections which are connected to the control gates 20 and 30 are formed in the areas masked by the resist layers R100. The resist layers R100 are then removed by a method such as dissolving or ashing.

Figure 9:
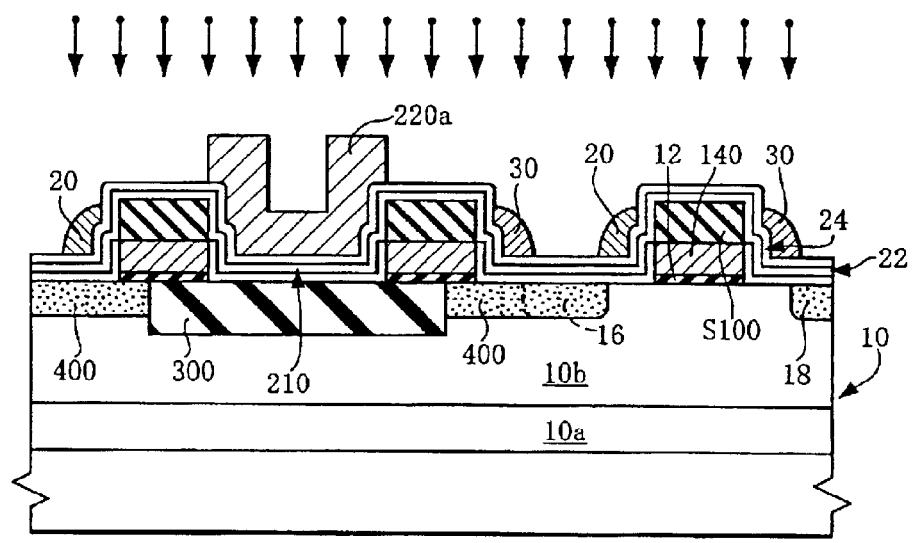
FIG. 9 is a cross-sectional view showing one step in the method of fabricating the semiconductor integrated circuit device shown in FIGS. 1 and 2.

(5) The impurity diffusion layers 16 and 18 which form either the source region or drain region are formed in the second well 10b by ion implantation of impurities such as N-type impurities into the entire surface, as shown in FIG. 9. The second gate insulating layer 22 may optionally be removed in the regions in which the impurity diffusion layers 16 and 18 are formed. A silicide layer such as a titanium silicide layer or cobalt silicide layer may be formed on the exposed areas of the impurity diffusion layers 16 and 18.

Figure 10:
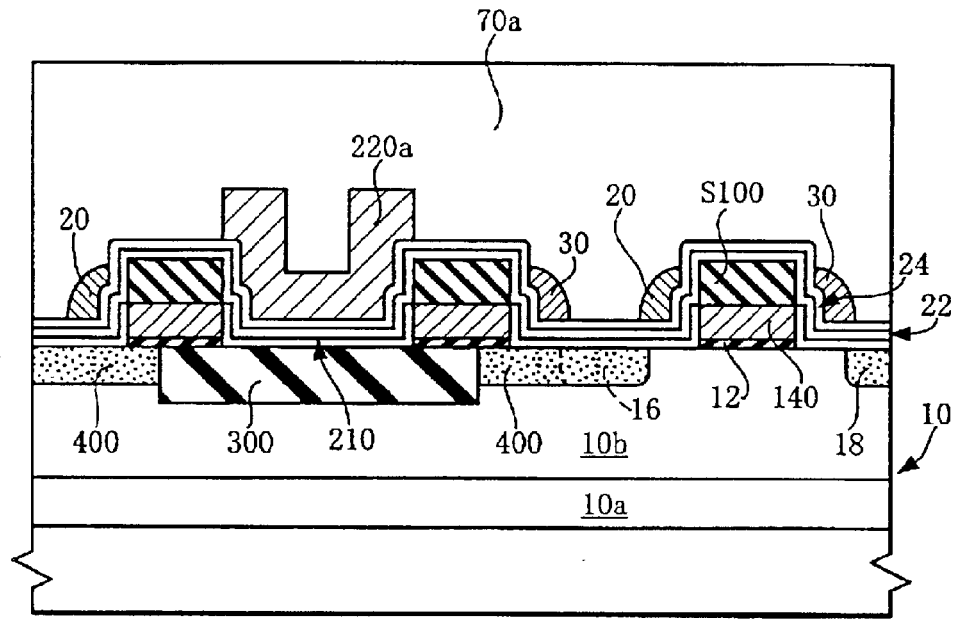
FIG. 10 is a cross-sectional view showing one step in the method of fabricating the semiconductor integrated circuit device shown in FIGS. 1 and 2.

(6) An insulating layer 70a is formed of silicon oxide, silicon nitride oxide, or the like over the entire surface of the semiconductor substrate 10 on which the first and second control gates 20 and 30, conductive layers 220a and the like are formed, as shown in FIG. 10.

Figure 11:
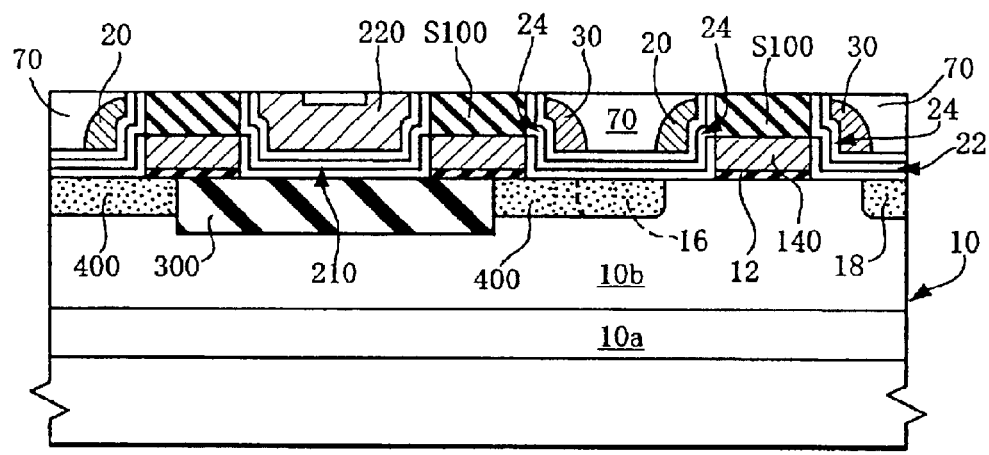
FIG. 11 is a cross-sectional view showing one step in the method of fabricating the semiconductor integrated circuit device shown in FIGS. 1 and 2.

(7) The insulating layer 70a is planarized by using a CMP process so that the stopper layer S100 is exposed, as shown in FIG. 11. The side insulating layers 24 formed on the sides of the word gate layer 140 and the stopper layer S100 are allowed to remain so as to project over the control gates 20 and 30. As a result, buried insulating layers 70 are formed between the side insulating layers 24 with the control gates 20 and 30 interposed. This step causes the first and second control gates 20 and 30 to be completely covered with the buried insulating layers 70 and exposes at least part of the conductive layers 220 in the common contact sections.

Figure 12:
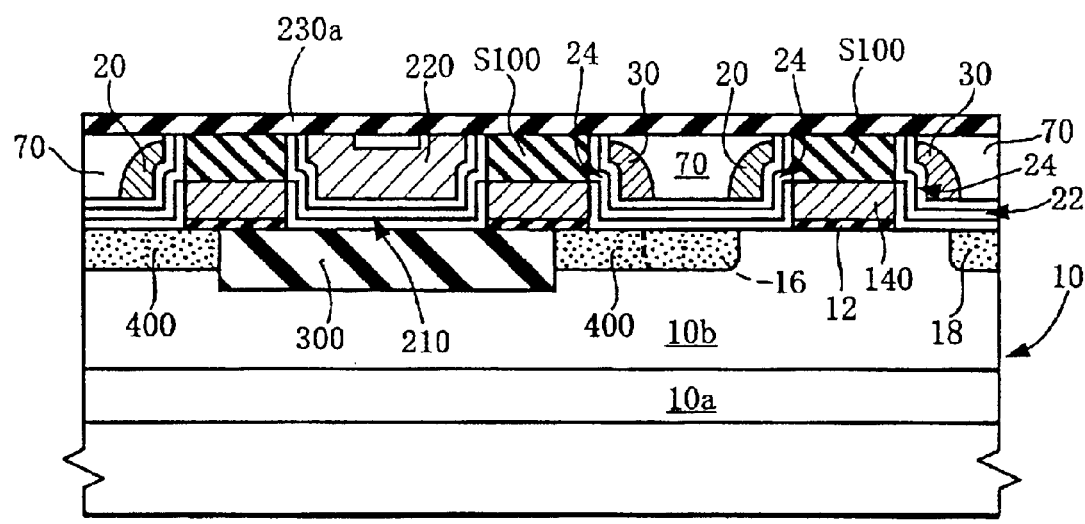
FIG. 12 is a cross-sectional view showing one step in the method of fabricating the semiconductor integrated circuit device shown in FIGS. 1 and 2.
Figure 13:
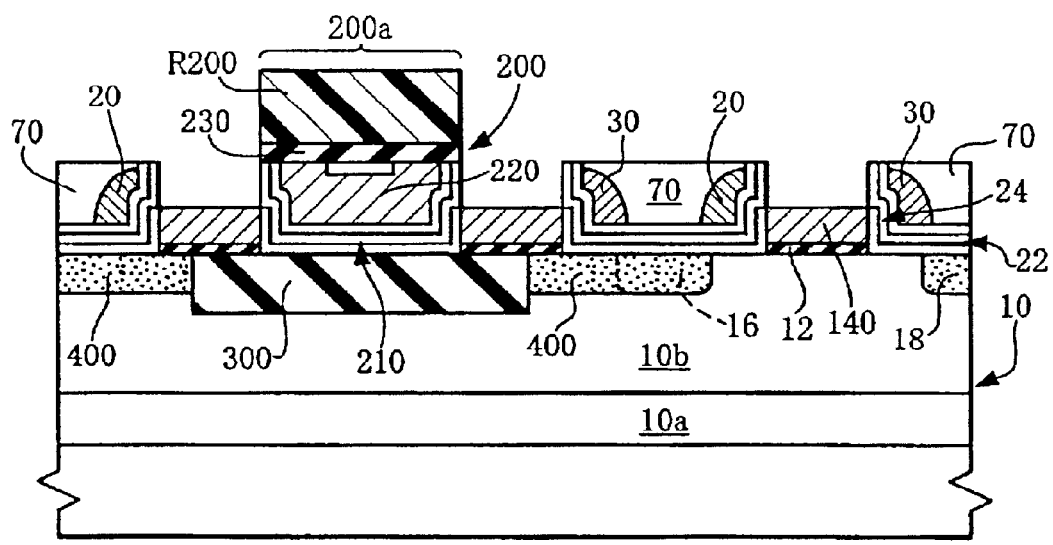
FIG. 13 is a cross-sectional view showing one step in the method of fabricating the semiconductor integrated circuit device shown in FIGS. 1 and 2.

(8) An insulating layer 230a such as a silicon nitride layer is formed over the entire surface of a laminate including the planarized buried insulating layers 70 and the stopper layer S100, as shown in FIG. 12. Then resist layers R200 are formed in the common contact section formation regions 200a, as shown in FIG. 13. The insulating layer 230a is patterned by using the resist layers R200 as a mask, thereby forming cap layers 230. The resist layers R200 are then removed by a conventional method.

Figure 14:
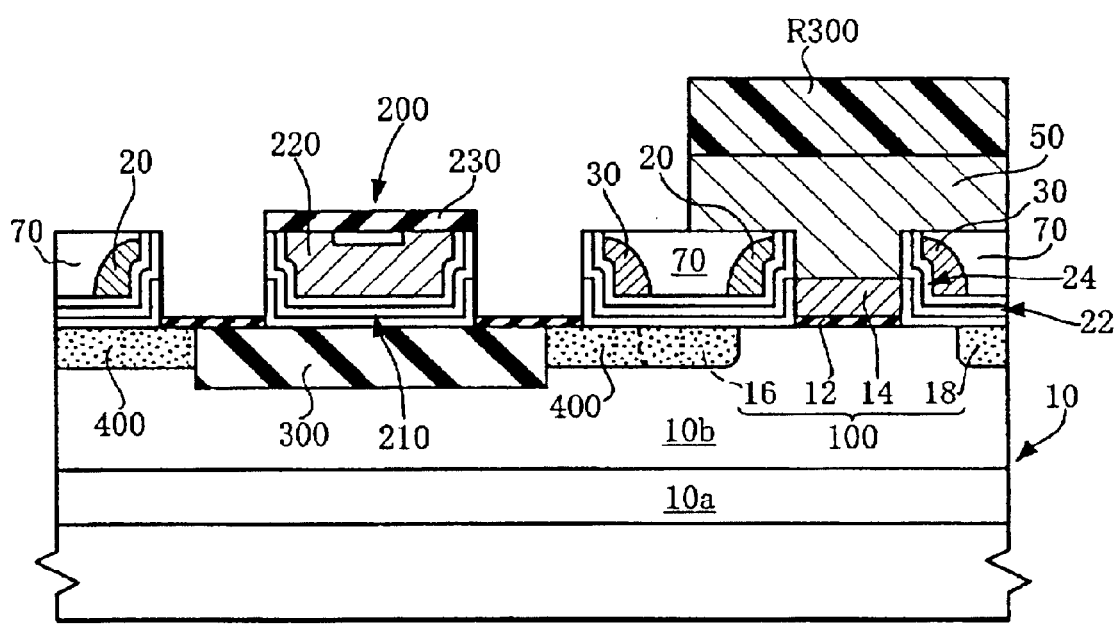
FIG. 14 is a cross-sectional view showing one step in the method of fabricating the semiconductor integrated circuit device shown in FIGS. 1 and 2.

(9) After forming a conductive layer consisting of a doped polysilicon layer, a metal layer, or an alloy layer such as a silicide layer, resist layers R300 are formed as shown in FIG. 14. Word lines 50 are then formed by patterning this conductive layer. If the resist layers R300 or word lines 50 are formed of a metal, the word gate layer 140 consisting of doped polysilicon is patterned by using the metal layer as a mask, thereby forming the word gates 14 arranged in a matrix.

Then the interlayer dielectric 72 is formed by a conventional method, and then the conductive layers 82 and the interconnect layers 80 connected to the common contact sections 200 are formed, as shown in FIG. 2.

The semiconductor integrated circuit device shown in FIG. 1 is fabricated by these steps.

According to this fabrication method, the common contact sections 200 can be formed together with the control gates 20 and 30 in the shape of sidewalls without increasing the number of steps. The common contact section 200 has a size close to at least the widths of the impurity diffusion layers 16 and 18, whereby a sufficiently large contact area can be secured. According to the present invention, therefore, reliable electrical connection with the control gates 20 and 30 can be achieved through the common contact sections 200 even if the control gates 20 and 30 are shaped as sidewalls for which it is difficult to provide a sufficient contact region.

3. Modification

Figure 15:
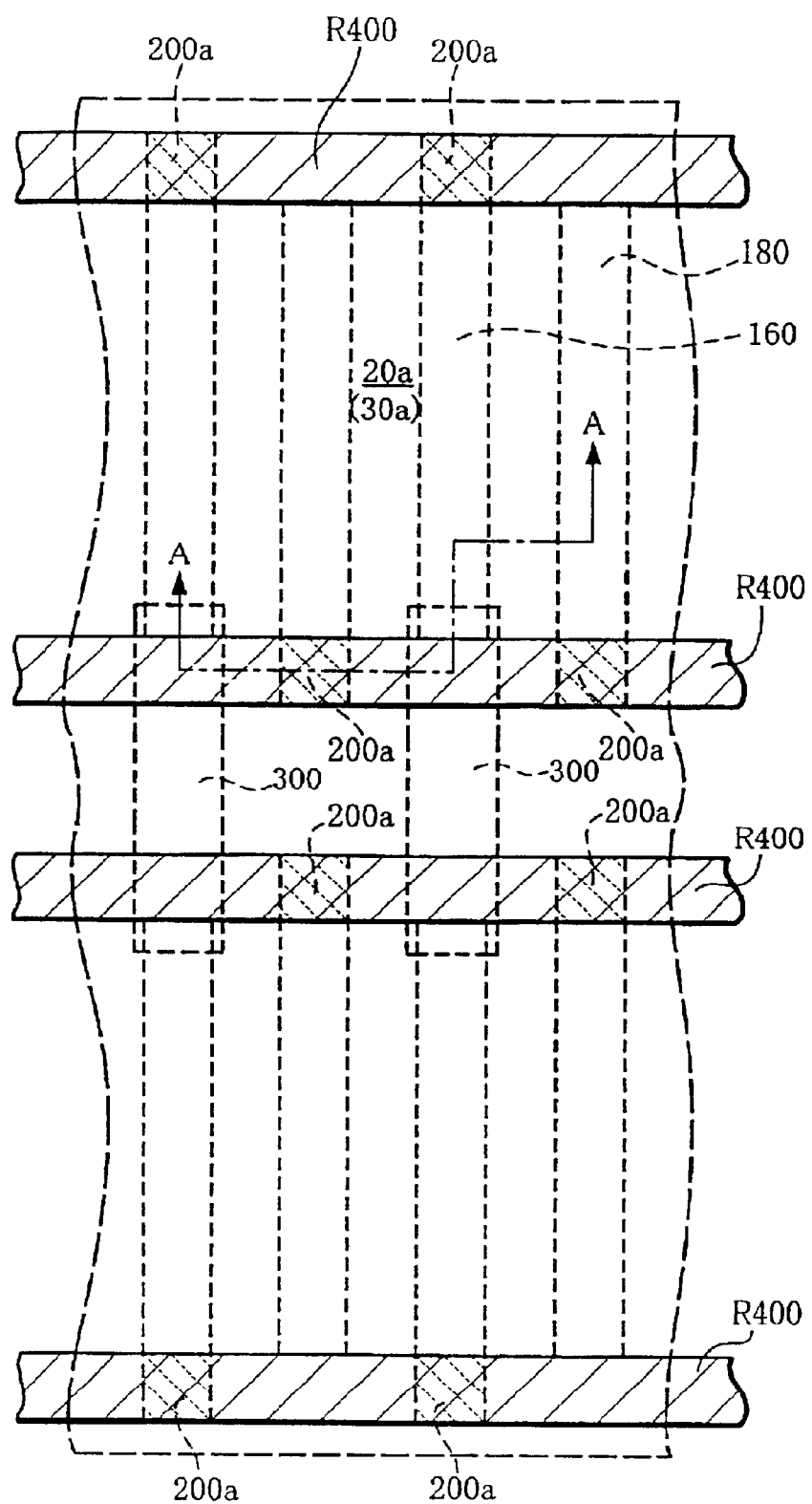
FIG. 15 is a plan view showing a modification of one step in the method of fabricating the semiconductor integrated circuit device according to the present invention.
Figure 16:
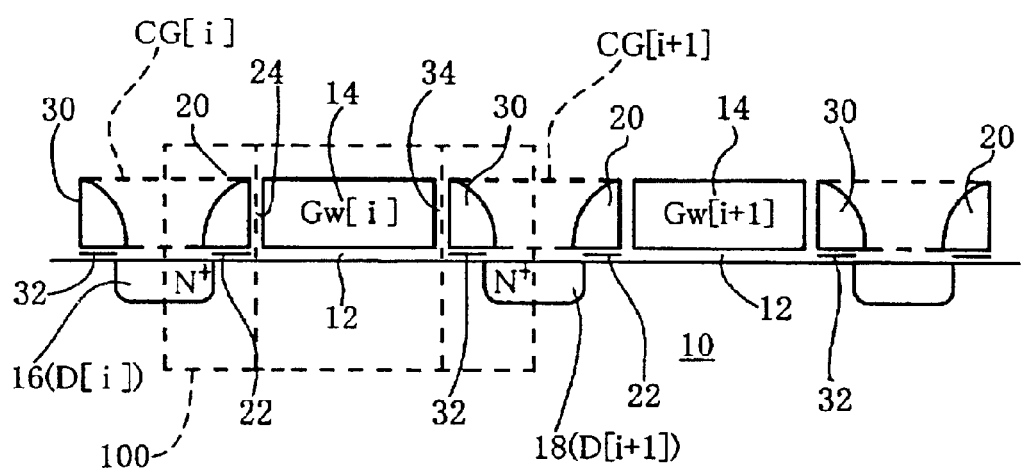
FIG. 16 is a cross-sectional view showing a conventional MONOS memory cell.

A modification of this embodiment of the present invention is described below with reference to FIG. 15. FIG. 15 is a plan view showing the step (3) in the above embodiment and corresponds to FIG. 7. In FIG. 15, components that are the same as those shown in FIG. 7 are denoted by the same reference numbers, and further description thereof is omitted.

In the configuration in FIG. 7, the resist layers R100 are formed only in the regions corresponding to the common contact section formation regions 200a. In contrast, the configuration in FIG. 15 has resist layers R400 formed continuously so as to cover a plurality of common contact section formation regions 200a present in the row direction. In comparison with the separate resist layers R100 shown in FIG. 7, use of such continuous resist layers R400 reduces the proximity effect of light during lithography, enabling more accurate patterning.

In this modification, the doped polysilicon layer 20a (30a) remains in the area other than the common contact section formation regions 200a. However, unnecessary portions may be removed by using the cap layers 230 as a mask when patterning the word gates 14 in the step (9) in the above embodiment.

The present invention is not limited to the above-described embodiment, and various modifications can be made within the scope of the invention. For example, a bulk semiconductor substrate is used as a semiconductor layer in the above embodiment. However, a semiconductor layer of an SOI substrate may be used.

What is claimed is:

1. A semiconductor integrated circuit device having a memory cell array in which nonvolatile semiconductor memory devices are arranged in a matrix with a plurality of rows and columns, wherein each of the nonvolatile semiconductor memory devices comprises:

a word gate formed on a semiconductor layer with a first gate insulating layer therebetween;

an impurity diffusion layer which forms either a source region or a drain region; and first and second control gates formed along either side of the word gate in the shape of sidewalls, wherein:

the first control gate being disposed on the semiconductor layer with a second gate insulating layer therebetween, and also on the word gate with a side insulating layer therebetween;

the second control gate being disposed on the semiconductor layer with another second gate insulating layer therebetween, and also on the word gate with another side insulating layer therebetween;

the first and second control gates extend in a first direction; and an end of the first control gate and an end of the second control gate of a pair of gates adjacent to each other in a second direction which intersects the first direction, are connected to each other through a pad-shaped common contact section that is disposed in a staggered arrangement relative an adjacent common contact section, the end of the first control gate and the end of the second control gate also being connected to an upper interconnect layer through a conductive layer disposed in a contact hole formed over the pad-shaped common contact section.

2. A semiconductor integrated circuit device having a memory cell array in which nonvolatile semiconductor memory devices are arranged in a matrix with a plurality of rows and columns, wherein each of the nonvolatile semiconductor memory devices comprises:

a word gate formed on a semiconductor layer with a first gate insulating layer therebetween;

an impurity diffusion layer which forms either a source region or a drain region; and first and second control gates in the shape of sidewalls formed along either side of the word gate, wherein:

the first control gate is disposed on the semiconductor layer with a second gate insulating layer therebetween, and also on the word gate with a side insulating layer therebetween;

the second control gate is disposed on the semiconductor layer with another second gate insulating layer therebetween, and also on the word gate with another side insulating layer therebetween;

the first and second control gates extend in a first direction; and a pair of the first and second control gates, adjacent each other in a second direction which intersects the first direction, are connected to each other through a pad-shaped common contact section that is disposed in a staggered arrangement relative an adjacent common contact section, the pair of the first and second control gates also being connected to an upper interconnect layer through a conductive layer disposed in a contact hole and formed over the pad-shaped common contact section.

3. The semiconductor integrated circuit device of claim 2, wherein the common contact section includes an insulating layer formed on the semiconductor layer, the insulating layer formed of a laminate comprising a first silicon oxide layer, a silicon nitride layer, and a second silicon oxide layer.

4. A semiconductor integrated circuit device having a memory cell array in which nonvolatile semiconductor memory devices are arranged in a matrix with a plurality of rows and columns, each of the nonvolatile semiconductor memory devices comprises:

a word gate formed on a semiconductor layer with a first gate insulating layer therebetween;

an impurity diffusion layer which forms either a source region or a drain region;

a first control gate formed along a first side of the word gate, the first control gate being disposed on the semiconductor layer with a second gate insulating layer therebetween, and also on the word gate with a side insulating layer therebetween;

a second control gate formed along a second side of the word gate, the second control gate being disposed on the semiconductor layer with another second gate insulating layer therebetween, and also on the word gate with another side insulating layer therebetween;

the first and second control gates extend in a first direction; and an end of the first control gate and an end of the second control gate that are adjacent to each other in a second direction which intersects the first direction, are connected to each other through a pad-shaped common contact section, the end of the first control gate and the end of the second control gate also being connected to an upper interconnect layer through a conductive layer disposed in a contact hole and formed over the pad-shaped common contact section.

5. The semiconductor integrated circuit device of claim 4, wherein the first and second control gates are formed in the shaped of sidewalls along either side of the word gate.

6. The semiconductor integrated circuit device of claim 4, wherein the common contact section includes an insulating layer formed on the semiconductor layer, the insulating layer formed of a laminate comprising a first silicon oxide layer, a silicon nitride layer, and a second silicon oxide layer.

7. The semiconductor integrated circuit device of claim 4, wherein the common contact section are staggered relative to each other.

8. The semiconductor integrated circuit device of claim 4, wherein the common contact section is connected to the end of the control gate and to the end of the second control gate, and includes a common contact section conductive layer that is formed of the same material as the first and second control gates.

9. The semiconductor integrated circuit device having a memory cell array in which nonvolatile semiconductor memory devices are arranged in a matrix with a plurality of rows and columns, wherein each of the nonvolatile semiconductor memory devices comprises:

a word gate formed on a semiconductor layer with a first gate insulating layer therebetween;

an impurity diffusion layer which forms either a source region or a drain region;

a first control gate in the shaped of a sidewall formed along one side of the word gate and disposed on the semiconductor layer with a second gate insulating layer therebetween; and also on the word gate with a side insulating layer therebetween; and a second control gate in the shape of a sidewall formed along another side of the word gate and disposed on the semiconductor layer with another second gate insulating layer therebetween, and also on the word gate with another side insulating layer therebetween, wherein two nonvolatile semiconductor memory devices adjacent to each other in a row direction and share the impurity diffusion layer comprise: a pair of first and second control gates facing each other with the impurity diffusion layer therebetween, are connected to each other surrounding the impurity diffusion layer and connected to a common contact section.

10. The semiconductor integrated circuit device as defined in claim 9,
wherein the common contact section is connected to the first and second control gates and includes a conductive layer formed of the same material as the first and second control gates.

11. The semiconductor integrated circuit device as defined in claim 9, wherein:
the side insulating layers are located between the word gate and the first and second control gates; and
the upper ends of the side insulating layers are located higher than the first and second control gates with respect to the semiconductor layer.

12. The semiconductor integrated circuit device as defined in claim 9, wherein:
a buried insulating layer is formed between the two side insulating layers disposed in contact with the first and second control gates; and
the buried insulating layer covers the adjacent first and second control gates.

13. The semiconductor integrated circuit device as defined in claim 9,
wherein the second gate insulating layer is formed of a laminate consisting of a first silicon oxide layer, a silicon nitride layer, and a second silicon oxide layer.

14. The semiconductor integrated circuit device as defined in claim 9,
wherein the side insulating layer is formed of a first silicon oxide layer, a silicon nitride layer, and a second silicon oxide layer.

15. The semiconductor integrated circuit device as defined in claim 9,
wherein the common contact section includes an insulating layer formed on the semiconductor layer, the conductive layer formed on the insulating layer, and a cap layer formed on the conductive layer.

16. The semiconductor integrated circuit device as defined in claim 15,
wherein the insulating layer is formed of a laminate consisting of a first silicon oxide layer, a silicon nitride layer, and a second silicon oxide layer.

17. The semiconductor integrated circuit device as defined in claim 9,
wherein the common contact section is provided in contact with one end of the impurity diffusion layer.

18. The semiconductor integrated circuit device as defined in claim 17,
wherein the common contact sections are staggered relative to each other.

19. A semiconductor integrated circuit device having a memory cell array in which nonvolatile semiconductor memory devices are arranged in a matrix with a plurality of rows and columns,
wherein each of the nonvolatile semiconductor memory devices comprises:
a word gate formed on a semiconductor layer with a first gate insulating layer therebetween;
an impurity diffusion layer forms either a source region or a drain region; and
first and second control gates in the shape of sidewalls formed along either side of the word gate, wherein:

the first control gate is disposed on the semiconductor layer with a second gate insulating layer therebetween, and also on the word gate with a side insulating layer therebetween;
the second control gate is disposed on the semiconductor layer with another second gate insulating layer therebetween, and also on the word gate with another side insulating layer therebetween;
the first and second control gates extends in a first direction; and
a pair of the first and second control gates, adjacent each other in a second direction which intersects the first direction, are connected to each other through a pad-shaped common contact section, the pair of first and second control gates also being connected to an upper interconnect layer through a conductive layer disposed in a contact hole and formed over the pad-shaped common contact section.

20. The semiconductor integrated circuit device as defined in claim 19,
wherein each of the first and second control gates is formed of a conductive layer extending in the direction in which the impurity diffusion layer extends.

21. The semiconductor integrated circuit device as defined in claim 19,
wherein the common contact section is connected to the first and second control gates and includes a common contact section conductive layer formed of the same material as the first and second control gates.

22. The semiconductor integrated circuit device as defined in claim 19, wherein:
the side insulating layers are located between the word gate and the first and second control gates; and
the upper ends of the side insulating layers are located higher than the first and second control gates with respect to the semiconductor layer.

23. The semiconductor integrated circuit device as defined in claim 19, wherein:
a buried insulating layer is formed between the two side insulating layers disposed in contact with the first and second control gates; and
the buried insulating layer covers the adjacent first and second control gates.

24. The semiconductor integrated circuit device as defined in claim 19,
wherein the common contact section is provided in contact with one end of the impurity diffusion layer.

25. The semiconductor integrated circuit device as defined in claim 19,
wherein the common contact sections are staggered relative to each other.

26. The semiconductor integrated circuit device as defined in claim 19, wherein:
the memory cell array is divided into a plurality of blocks; and
the impurity diffusion layers in blocks adjacent to each other in the first direction are connected to each other through a contact impurity diffusion layer formed in the semiconductor layer.

27. The semiconductor integrated circuit device an defined in claim 19,
wherein the second gate insulating layer is formed of a laminate consisting of a first silicon oxide layer, a silicon nitride layer, and a second silicon oxide layer.

28. The semiconductor integrated circuit device as defined in claim 19,
wherein the side insulating layer is formed of a first silicon oxide layer, a silicon nitride layer, and a second silicon oxide layer.

29. The semiconductor integrated circuit device as defined in claim 19,
wherein the common contact section includes an insulating layer formed on the semiconductor layer, a common contact section conductive layer formed on the insulating layer, and a cap layer formed on the common contact section conductive layer.

30. The semiconductor integrated circuit device as defined in claim 29,
wherein the insulating layer is formed of a laminate consisting of a first silicon oxide layer, a silicon nitride layer, and a second silicon oxide layer.

* * * * *

UNITED STATES PATENT AND TRADEMARK OFFICE
CERTIFICATE OF CORRECTION

PATENT NO. : 6,809,385 B2
DATED : October 26, 2004
INVENTOR(S) : Akihiko Ebina and Yutaka Maruo It is certified that error appears in the above-identified patent and that said Letters Patent is hereby corrected as shown below:

Title page,
Item [73], Assignee, replace as follows:
-- [73]   Assignee:       Seiko Epson Corporation, Tokyo (JP); Halo LSI Design & Device Technology, Inc., Wappingers Falls, NY (US) --

Signed and Sealed this

Twenty-ninth Day of March, 2005

JON W. DUDAS
*Director of the United States Patent and Trademark Office*